United States Patent [19]
Courtright et al.

[11] Patent Number: 5,892,249
[45] Date of Patent: Apr. 6, 1999

[54] INTEGRATED CIRCUIT HAVING REPROGRAMMING CELL

[75] Inventors: David A. Courtright, Richardson; David L. Trawick, Plano, both of Tex.

[73] Assignee: National Semiconductor Corporation, Santa Clara, Calif.

[21] Appl. No.: 605,831

[22] Filed: Feb. 23, 1996

[51] Int. Cl.$^6$ ............................ H01L 27/10; H01L 23/48; H01L 23/52; H01L 29/40
[52] U.S. Cl. ........................ 257/209; 257/203; 257/210; 257/211; 257/758
[58] Field of Search ............................ 257/202, 203, 257/207, 208, 209, 210, 211, 754, 756, 758

[56] References Cited

U.S. PATENT DOCUMENTS

| | | | |
|---|---|---|---|
| 4,931,946 | 6/1990 | Ravindra et al. | 364/490 |
| 4,961,053 | 10/1990 | Krug | 324/158 |
| 5,214,299 | 5/1993 | Gal et al. | 257/208 |
| 5,315,230 | 5/1994 | Hively et al. | 257/48 |
| 5,459,342 | 10/1995 | Nogami et al. | 257/209 |
| 5,578,861 | 11/1996 | Kinoshita et al. | 257/529 |
| 5,608,245 | 3/1997 | Martin | 257/291 |

*Primary Examiner*—Ngân V. Ngô
*Attorney, Agent, or Firm*—Andrew S. Viger

[57] ABSTRACT

An integrated circuit is reprogrammable in metal using (a) a set of spare devices, and (b) separate arrays of spare rows and columns. The spare rows are formed in the top metal layer, and the spare columns are formed in the next to the top metal layer (for example, metal layers 4 and 5 of a 5 level metal process). Use of arrays of spare rows/columns facilitates silicon debug of the integrated circuit using FIB (focused ion beam) reprogramming without requiring FIB connections of more than 500 μm.

8 Claims, 13 Drawing Sheets

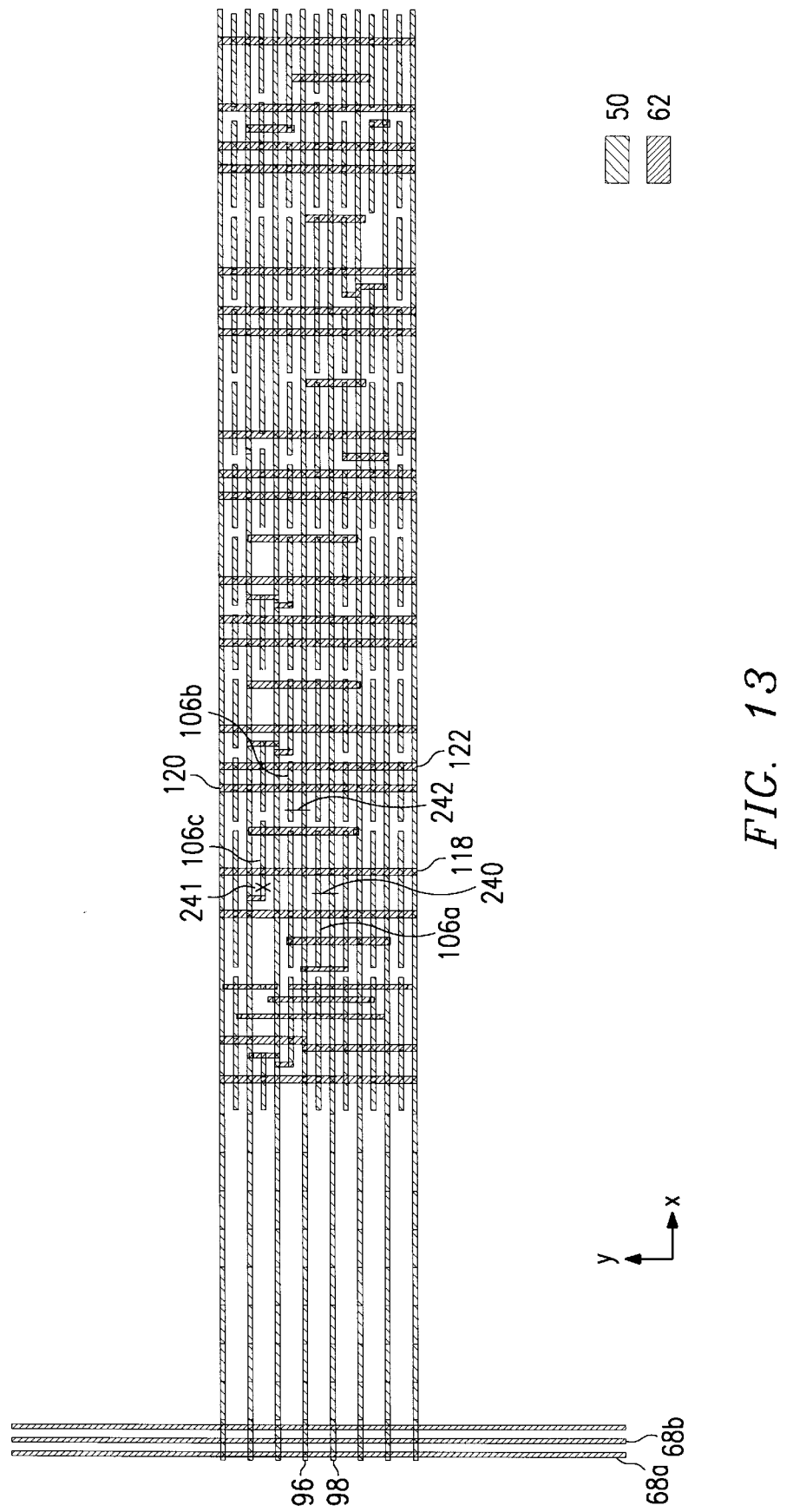

INTEGRATED CIRCUIT HAVING REPROGRAMMING CELL

TECHNICAL FIELD OF THE INVENTION

This invention relates generally to integrated circuits. The invention more particularly relates to debugging or implementing prototype design changes in integrated circuits, such as microprocessors.

BACKGROUND OF THE INVENTION

Modern integrated circuits, including modern microprocessors, utilize stacked layers of a conductive material to provide electrical connectivity between various devices formed in a base layer of semiconductor materials. These conductive layers, which are electrically isolated by insulator layers formed between each conductive layer, carry signals within and between the devices during operation of the integrated circuit. Stacked conductive layers are used to interconnect the devices, instead of a single conductive layer, in order to minimize the footprint of the integrated circuit. By making integrated circuits with smaller footprints, complex electronic equipment can be employed in many applications where space is critical, such as in aircraft; space vehicles; and consumer products such as computers, watches, calculators, automobiles, telephones, televisions, and appliances. In addition, reducing the footprint of an integrated circuit minimizes the separation of the various devices and correspondingly minimizes the time delay of signals transferred between the devices.

However, this stacking of conductive layers also makes the debugging of an integrated circuit and the implementation of prototype design changes to an integrated circuit a more difficult and time consuming process. To implement physical changes to an integrated circuit required by such debugging or design changes, one typically (1) modifies the masks for the semiconductor layer, the conductive layers, or both the semiconductor and conductive layers or (2) attempts to utilize existing conductive lines and devices in the circuit. As used in this document, a "device" refers to a plurality of CMOS (complimentary metal-oxide-silicon) transistors interconnected by electrically conductive lines in the conventional manner to form inverters, AND gates, OR gates, NAND gates, NOR gates, latches, or other conventional integrated circuit devices.

Modifying masks and remanufacturing the integrated circuit may take as long as eight weeks or more for an integrated circuit as complex as a microprocessor. During this time, an error which one is attempting to debug may prevent or greatly reduce debugging efforts on the rest of the microprocessor.

Attempting to utilize existing conductive lines and devices in the circuit is also a time consuming process. First, one must select the device to be utilized. Next, one must form the necessary interconnections between devices. Such interconnections are typically formed using conventional focused ion beam (FIB) equipment, such as the IDS P2X ProbePoint Extension sold by Schlumberger. The FIB, or similar equipment used to make these interconnections, is capable of removing conductive and/or insulator layers of a circuit to create a via providing access to a particular device or conductive line; cutting an existing conductive line in a circuit; and depositing conductive materials such as metals and metal alloys within vias and on the top insulator layer of a circuit.

FIG. 15a provides a first example of such a conventional interconnection in which a "problem" inverter 400, having an input 402 and an output 404, is replaced with a "cannibalized" inverter 406, having an input 408 and an output 410. First, a FIB is used to cut through the conductive and insulator layers (not shown) of the microprocessor to create vias 412 providing access to input lines 402 and 408 and output lines 404 and 410. Next, a FIB is used to deposit a conductive line 414 in vias 412 and on the top insulator layer (not shown) of the microprocessor to interconnect input line 402 with input line 408. Similarly, a FIB is used to deposit a conductive line in vias 412 and on the top insulator layer (not shown) of the microprocessor to interconnect output line 404 with output line 410. Finally, a FIB is used to cut output line 404 to create a discontinuity 418, to cut input line 408 to create a discontinuity 420, and to cut output line 410 to create a discontinuity 422. As part of the selection of the device to be cannibalized, one should verify that the cannibalized device has no effect on the problem logic being debugged, the circuit logic to be modified, or other circuit logic which is dependent on the cannibalized device and is being debugged concurrently.

FIG. 15b provides a second example of such a conventional interconnection between a NAND gate 500, having an input 502, an input 504, and an output 506, and a second NAND gate 508, having an output 510. First, a FIB is used to cut through the conductive and insulator layers (not shown) of the microprocessor to create vias 512 providing access to input line 504 and output line 510. Next, a FIB is used to deposit a conductive line 514 in vias 412 and on the top insulator layer (not shown) of the microprocessor to interconnect input line 504 with output line 510. Finally, a FIB is used to cut input line 504 to create a discontinuity 516.

Creating such conventional interconnections with a FIB is a very time consuming process. Using a FIB to cut a via through a single conductive layer, and its corresponding insulator layer, typically requires on the order of one-half hour to one hour. In addition, using a FIB to deposit a conductive line having a length of 500 $\mu$m on the top insulator layer of a microprocessor typically takes on the order of five hours. One should note that in an integrated circuit as complex as a microprocessor, many more than the minimum of two FIB vias and one FIB conductive line may be required to form each of the above-described interconnections due to the complexity of the routing of the conductive layers.

Furthermore, when performing such conventional interconnections with a FIB, one often faces several additional problems other than the time consuming nature of the process, as described above. First, a FIB can only reliably deposit a conductive line having a length of no more than 500 $\mu$m to 1000 $\mu$m. Such limited FIB line length is due to the high resistance of FIB lines. Second, FIB lines are less reliable than conductive lines created by conventional masking due to a higher frequency of voids or discontinuities in FIB lines. Third, in many instances, such interconnections may not be possible due to the particular layout of the integrated circuit. For example, in many layouts, it is impossible to reliably create the FIB vias for the necessary interconnections due to existing conductive lines overlying a desired point in the circuit. As another example, some layouts may require a FIB line having a length greater than 1000 $\mu$m, and therefore it is not possible to create the necessary interconnections using a FIB. As a further example, some layouts may require a FIB line having a length greater than 500 $\mu$m, and therefore it is not possible to create the necessary interconnections using a FIB without a high possibility of reliability problems for the FIB line. In these situations, modifying the masks and remanufacturing the circuit may be the most practical option.

One should also note that it is conventional to include "spare devices" in modern microprocessors, as space on the semiconductor surface permits. As used in this document, a "spare device" refers to a device having no function in a routed integrated circuit as originally designed. However, the existence of spare devices may not always facilitate the above-described conventional interconnection process. For example, a spare device may be located on the circuit so as to require a FIB line of greater than 500 µm to 1000 µm. As another example, it may be impossible to create a FIB via to the input or output lines of a spare device due to existing conductive lines overlying the input or output lines. Therefore, a need exists in the industry to provide a technique of reprogramming an integrated circuit which requires a minimum amount of time and which does not suffer from the above-described limitations and reliability problems.

It is therefore an object of the present invention to provide an integrated circuit which can be reliably reprogrammed to debug errors or implement prototype design changes without requiring modification of masks and remanufacturing of the circuit.

It is a further object of the present invention to provide such an integrated circuit which can be reprogrammed in a minimum amount of time.

It is a further object of the present invention to provide such an integrated circuit in which conductive interconnections made by a FIB are no more than 500 µm in length.

Still other objects and advantages of the present invention will become apparent to those of ordinary skill in the art having reference to the following specification together with its drawings.

SUMMARY OF THE INVENTION

A preferred embodiment of the present invention is an integrated circuit including a first set of devices formed in a semiconductor layer; a reprogramming cell, including a set of spare devices formed in the semiconductor layer and a first array of spare conductive lines overlying the set of spare devices; and a second array of spare conductive lines overlying the semiconductor layer and proximate to the first set of devices and the reprogramming cell.

BRIEF DESCRIPTION OF THE DRAWINGS

For a more complete understanding of the present invention, and the advantages thereof, reference is now made to the following description taken in conjunction with the accompanying drawings, in which:

FIG. 13 illustrates the physical interconnection between the input line to the reprogramming cell of FIG. 6, a device in the reprogramming cell of FIG. 6, and an output line from the reprogramming cell of FIG. 6 according to the preferred embodiment of the present invention;

DETAILED DESCRIPTION OF THE PREFERRED EMBODIMENT

The preferred embodiment of the present invention and its advantages are best understood by referring to FIGS. 1 through 14 of the drawings, like numerals being used for like and corresponding parts of the various drawings one should note that while the preferred embodiment is described in connection with a microprocessor, the present invention is fully applicable to any integrated circuit which requires debugging of errors or prototyping of design changes by physically modifying the interconnections between devices.

Figure 1:
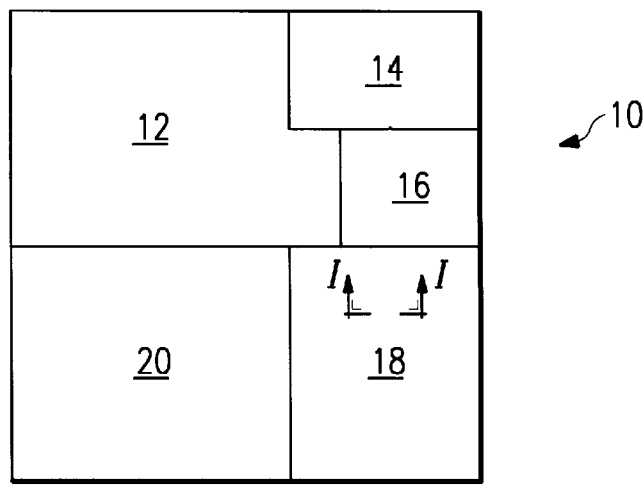
FIG. 1 illustrates the footprint of an exemplary microprocessor according to the preferred embodiment of the present invention.

Referring to FIG. 1, the footprint of an exemplary microprocessor 10 is generally divided into several functional units. These functional units include a data cache/translation buffer unit (DCTB) 12, a floating point unit (FPU) 14, a branch target buffer/instruction fetch unit (BTB/IFETCH) 16, an instruction decode unit (ID) 18, and an address calculation/execution unit (ACEX) 20. These functional units are by way of illustration, and a particular microprocessor, or other integrated circuit, may have a different arrangement of functional units or different functional units, depending on its specific application.

Microprocessors, as well as other integrated circuits, are fabricated on silicon wafers over a number of well-defined stages. Early stages include masking and diffusion of the n-wells and p-wells. Intermediate stages include the formation of doped polycrystalline silicon layers which are etched to form device gates and interconnects. The last stages include one or more levels of etched conductive (typically metal or metal alloy) layers which form low resistance interconnections within or between devices.

Figure 1A:
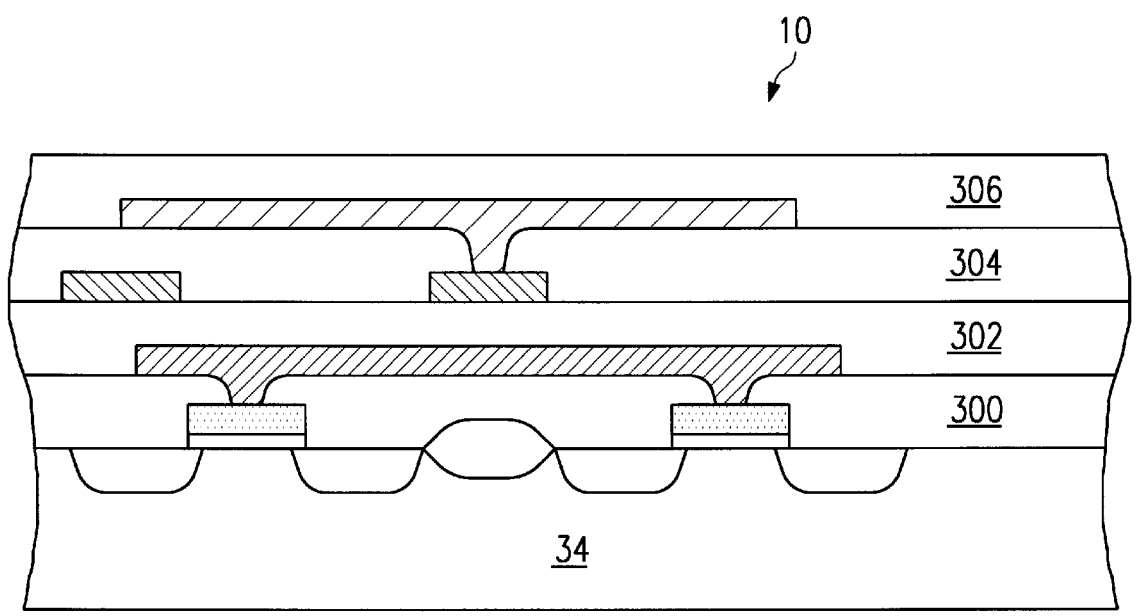
FIG. 1a is an arbitrary cross-section of the microprocessor of FIG. 1 taken in the direction shown by line I—I.

Microprocessor 10 is preferably formed using such conventional semiconductor fabrication techniques. As shown in FIG. 1a, microprocessor 10 includes a semiconductor layer 34, a doped polycrystalline silicon layer 35, a first conductive layer 36, an insulator layer 300 isolating first conductive layer 36 from polycrystalline silicon layer 35, a second conductive layer 62, an insulator layer 302 isolating second conductive layer 62 from first conductive layer 36, a top conductive layer 50, an insulator layer 304 isolating top conductive layer 50 from second conductive layer 62, and an insulator layer 306 overlying top conductive layer 50. Insulator layers 300, 302, 304, and 306 are preferably an oxide, nitride, or polyamide. Although FIG. 1a shows only one polycrystalline silicon layer and three conductive layers overlying semiconductor layer 34, these numbers are for illustration only, and the present invention is applicable to integrated circuits having fewer or more polycrystalline silicon or conductive layers.

Figure 2:
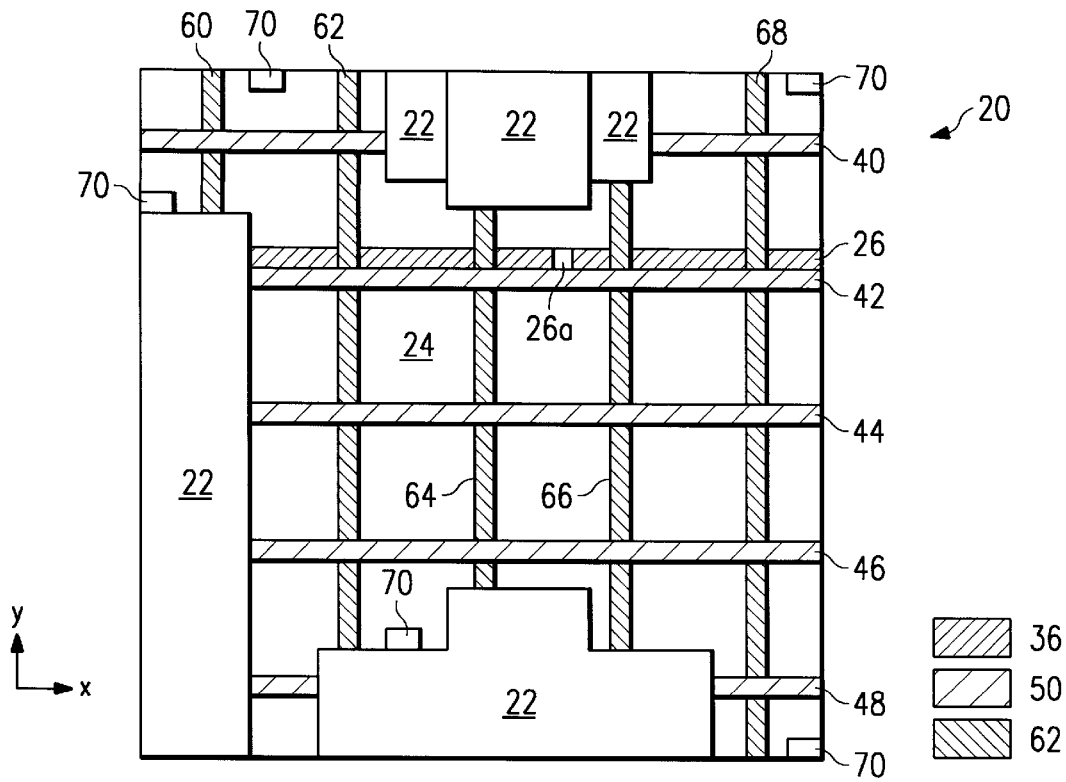
FIG. 2 illustrates the footprint of an exemplary functional unit of the microprocessor of FIG. 1.

FIG. 2 shows the footprint of ACEX unit 20. ACEX unit 20 is generally divided into custom layout areas 22 and an automated place and route area 24. As is conventional, custom layout areas 22 are manually designed, and automated place and route area 24 is designed using conventional place and route software, such as SVR GARDS by Silicon Valley Research, CELL3 by Cadence, or ARCCELL by Avant!. The detailed layouts of custom layout areas 22 are not shown in FIG. 2 for clarity of illustration. Similarly, semiconductor layer 34, polycrystalline silicon layer 35, and insulator layers 300, 302, 304, and 306 of microprocessor 10 are also not shown in FIG. 2 for clarity of illustration.

Figure 3:
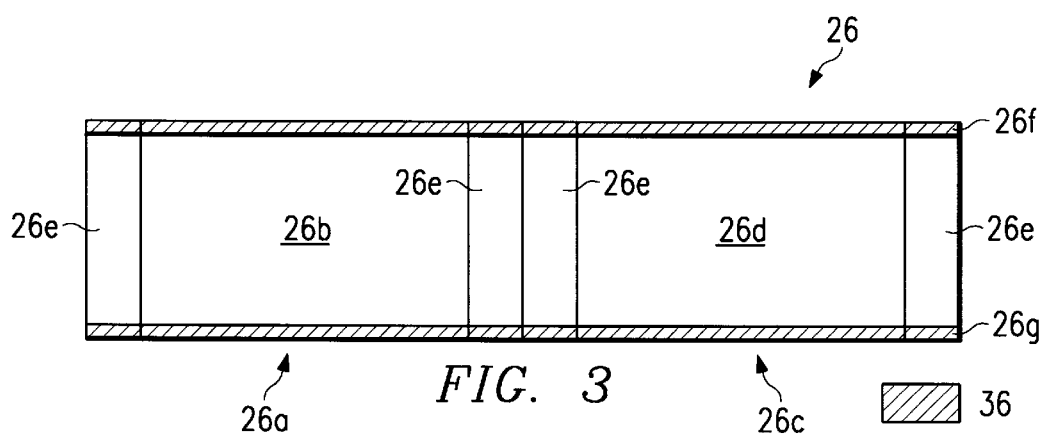
FIG. 3 illustrates a partial, detailed view of a standard cell cite of the functional unit of FIG. 2.

In the preferred embodiment, automated place and route area 24 includes a plurality of standard cell cites, only one of which, a standard cell cite 26, is shown in FIG. 2 for clarity of illustration. Standard cell cite 26 is preferably oriented in the x-axis direction as shown in FIG. 2, and it preferably includes a plurality of standard logic cells separated by spacer cells. As shown in FIG. 3, a portion of standard cell cite 26 includes standard logic cells 26a and 26c separated by spacer cells 26e. Standard logic cells 26a and 26c house devices 26b and 26d, respectively. Standard logic cell 26a, standard logic cell 26c, and spacer cells 26e preferably interconnect to form a common power line 26f and a common ground line 26g. Standard cell cite 26 is preferably formed and interconnected in semiconductor layer 34, polycrystalline layer 35, and first conductive layer 36.

Figure 4:
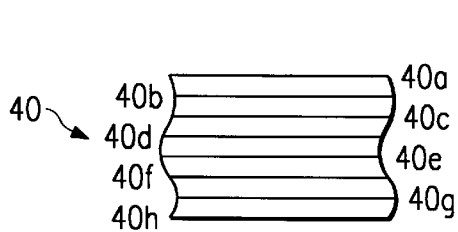
FIG. 4 illustrates a partial, detailed view of a spare row cell according to the preferred embodiment of the present invention.

Referring again to FIG. 2, automated place and route area 24 further includes spare row cells 40, 42, 44, 46, and 48. As used in this document, "row" refers to a conductive line of an integrated circuit running in the x-axis direction as shown in FIG. 2. In addition, a "spare row" refers to a row which carries no signal in a routed integrated circuit as originally designed. Although only five spare row cells are shown in FIG. 2, this number is for illustration only and different applications may include different numbers of spare row cells. Spare row cells 40, 42, 44, 46, and 48 are preferably equally spaced in the y-axis direction no more than about 1000 μm apart, and most preferably no more than about 540 μm apart, in automated place and route area 24. As shown in FIG. 4, spare row cell 40 preferably includes a plurality of spare rows 40a, 40b, 40c, 40d, 40e, 40f, 40g, and 40h. Although eight spare rows are shown in spare row cell 40, this number is for illustration only and different applications may include different numbers of spare rows. Spare row cells 42, 44, 46, and 48 are similar in structure to spare row cell 40. As shown in FIG. 2, spare row cells 40, 42, 44, 46, and 48 are preferably formed in top conductive layer 50.

Figure 5:
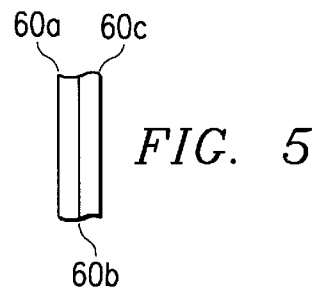
FIG. 5 illustrates a partial, detailed view of a spare column cell according to the preferred embodiment of the present invention.

Referring to FIG. 2, automated place and route area 24 further includes spare column cells 60, 62, 64, 66, and 68. As used in this document, a "column" refers to a conductive line of an integrated circuit running in the y-axis direction as shown in FIG. 2. In addition, a "spare column" refers to a column which carries no signal in a routed integrated circuit as originally designed. Although only five spare column cells are shown in FIG. 2, this number is for illustration only and different applications may include different numbers of spare column cells. Spare column cells 60, 62, 64, 66, and 68 are preferably equally spaced in the x-axis direction no more than about 1000 μm apart, and most preferably no more than about 375 μm apart, in automated place and route area 24. As shown in FIG. 5, spare column cell 60 preferably includes a plurality of spare columns 60a, 60b, and 60c. Although three spare columns are shown in spare column cell 60, this number is for illustration only and different applications may include different numbers of spare rows. Spare column cells 62, 64, 66, and 68 are similar in structure to spare column cell 60. As shown in FIG. 2, spare column cells 60, 62, 64, 66, and 68 are preferably formed in second conductive layer 62, which is the conductive layer below top conductive layer 50 in microprocessor 10.

As described above, spare row cells 40, 42, 44, 46, and 48 and spare column cells 60, 62, 64, 66, and 68 form an array of conductive lines overlying automated place and route area 24 of ACEX unit 20. Spare row cells 40, 42, 44, 46, and 48 and spare column cells 60, 62, 64, 66, and 68 are not coupled to each other or the standard cell cites, including standard cell cite 26, in microprocessor 10 as originally designed. As used in this document, "coupled" means electrically coupled or interconnected.

Referring again to FIG. 2, automated place and route area 24 also includes a plurality of reprogramming cells 70. Each reprogramming cell 70 is preferably located proximate one of spare column cells 60, 62, 64, 66, and 68 for interconnection with one of the spare column cells, as is described in greater detail hereinbelow. Although only five reprogramming cells are shown in FIG. 2, this number is for illustration only and different applications may include different numbers of reprogramming cells.

As mentioned above, automated place and route area 24 preferably includes a plurality of standard cell cites. Each of these standard cell cites is similar in structure and orientation to standard cell cite 26, and the standard cell cites are preferably formed in all areas of automated place and route area 24 not occupied by a spare row cell, a spare column cell, or a reprogramming cell.

Figure 6:
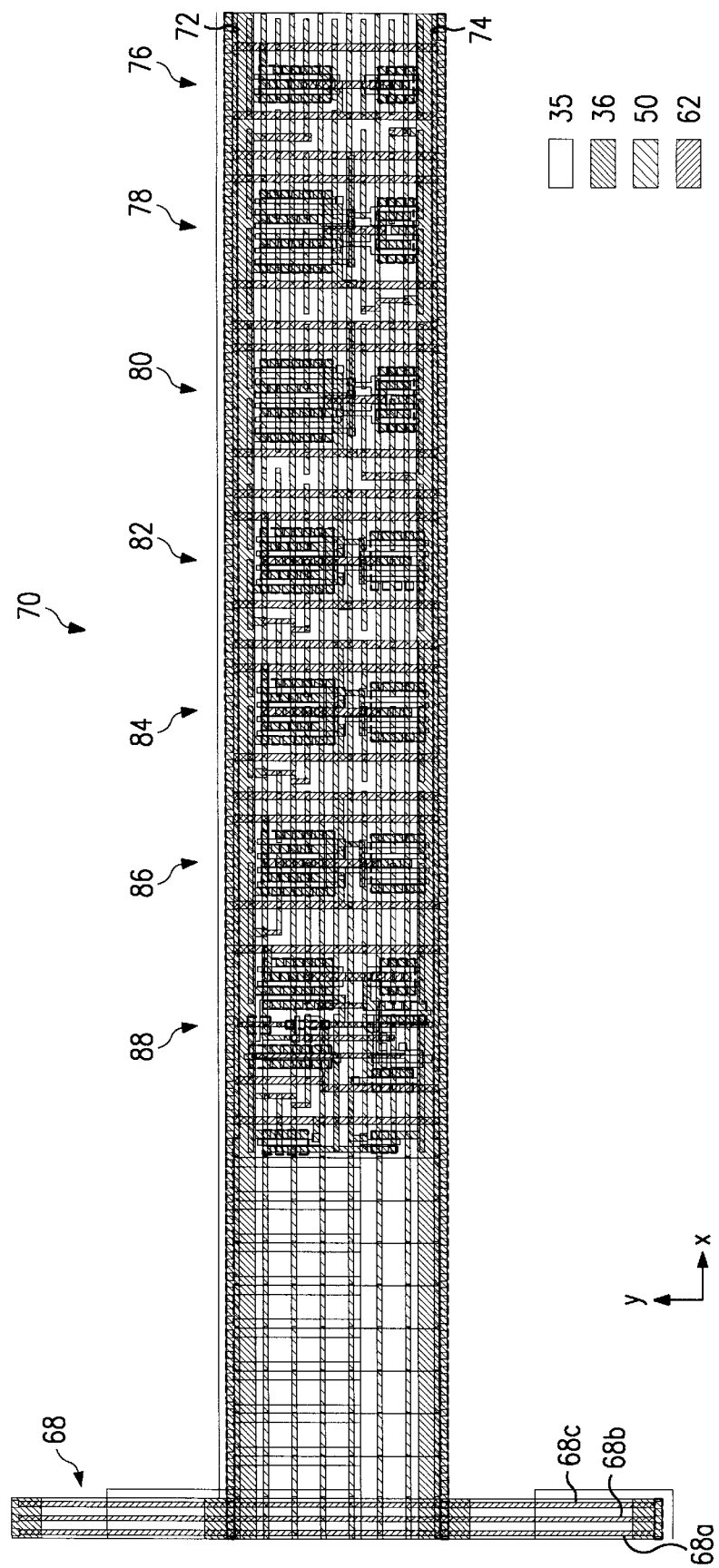
FIG. 6 illustrates a reprogramming cell and a spare column cell according to the preferred embodiment of the present invention.

FIGS. 6, 7, and 7a through 7d illustrate the preferred embodiment of reprogramming cell 70. Insulator layers are not shown in these figures for purposes of illustration. Similar to standard cell cites 26, reprogramming cell 70 preferably has a common power line 72 and a common ground line 74 formed in first conductive layer 36. Referring to FIG. 6, reprogramming cell 70 preferably includes an inverter 76; NOR gates 78 and 80; NAND gates 82, 84, and 86; and a latch 88 coupled to common power line 72 and common ground line 74 in first conductive layer 36. Inverter 76; NOR gates 78 and 80; NAND gates 82, 84, and 86; and latch 88 are spare devices for ACEX unit 20. Although FIG. 6 illustrates reprogramming cell 70 as having only seven spare devices, this number is for illustration only and different applications may include different numbers of spare devices. In addition, reprogramming cell 70 may also include different spare devices, or different combinations of spare devices, than shown in FIG. 6. As is most clearly shown in FIGS. 7c and 7d, the spare devices of reprogramming cell 70 are preferably interconnected in polycrystalline silicon layer 35, first conductive layer 36, and second conductive layer 62 using conventional semiconductor fabrication techniques.

Figure 7:
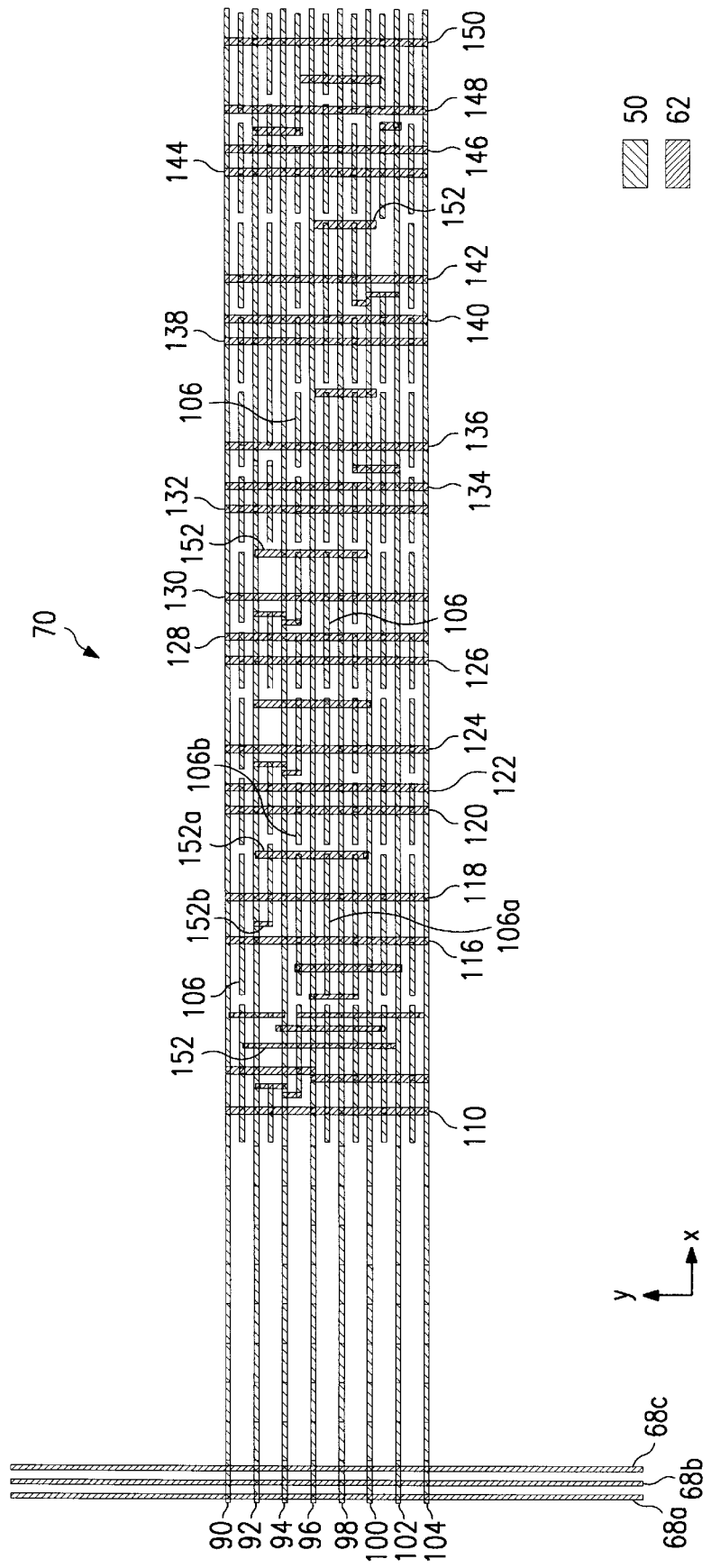
FIG. 7 illustrates the top conductive layer and the conductive layer directly below the top conductive layer of the reprogramming cell of FIG. 6.

FIGS. 7 and 7a through 7d most clearly illustrate the preferred array of spare conductive lines included in reprogramming cell 70. Referring to FIG. 7, conductive rows 90, 92, 94, 96, 98, 100, 102, and 104 are formed in top conductive layer 50 and extend the entire length of reprogramming cell 70. Conductive rows 90, 92, 94, 96, 98, 100, 102, and 104 include a portion overlying one of spare column cells 60, 62, 64, 66, and 68 of FIG. 2. As shown in FIGS. 6 and 7, conductive rows 90, 92, 94, 96, 98, 100, 102, and 104 overlie spare column cell 68, and its corresponding spare rows 68a, 68b, and 68c. Referring to FIG. 7, a plurality of conductive connector rows 106 are also formed in top conductive layer 50 between respective ones of conductive rows 90, 92, 94, 96, 98, 100, 102, 104. Conductive columns 110, 116, 118, 120, 122, 124, 126, 128, 130, 132, 134, 136, 138, 140, 142, 144, 146, 148, and 150 are formed in second conductive layer 62 and extend the entire width of reprogramming cell 70. A plurality of conductive connector columns 152 are also formed in second conductive layer 62 between respective ones of conductive columns 110, 116, 118, 120, 122, 124, 126, 128, 130, 132, 134, 136, 138, 140, 142, 144, 146, 148, and 150. The various functions of the preferred array of spare conductive lines in reprogramming cell 70 will now be discussed in greater detail.

As is best shown in FIGS. 7a through 7d, conductive columns 110, 116, 118, 120, 122, 124, 126, 128, 130, 132, 134, 136, 138, 140, 142, 144, 146, 148, and 150 of reprogramming cell 70 are coupled to the various input lines and output lines of inverter 76; NOR gates 78 and 80; NAND gates 82, 84, and 86; and latch 88 using conventional via and metallization techniques. These input and output lines are preferably formed in first conductive layer 36, as is conventional. For example, conductive column 118 is coupled to an input line 160 of NAND gate 86 through a via 164, and conductive column 122 is coupled to an input line 162 of NAND gate 86 through a via 166. Similarly, conductive column 120 is coupled to the output line 168 of NAND gate 86 through a via 170. One should note that all vias coupling adjacent conductive or polycrystalline silicon layers in reprogramming cell 70 are generally designated with a small square in FIGS. 6, 7, and 7a through 7d.

As is best shown in FIGS. 7 and 7a through 7d, the conductive connector columns 152 of reprogramming cell 70 generally form interconnections within or between devices of reprogramming cell 70 using conventional via and metallization techniques. For example, conductive connector column 152a interconnects separated portions of output line 168 of NAND gate 86 using vias 172 and 174. As another example, conductive connector column 152b couples input line 160 of NAND gate 86 to common power line tie-off 175 through a via 176a, a via 176b, conductive connector row 106c, a via 176c, conductive connector column 118. One should note that the numbers and layout of conductive connector columns 152 is application specific and will vary for particular applications of reprogramming cell 70.

As is shown in FIGS. 7 and 7a through 7d, the conductive connector rows 106 are coupled to the conductive columns and the conductive connector columns 152 of reprogramming cell 70 using conventional via and metallization techniques. For example, conductive connector column 106a is coupled to conductive column 118 through a via 178, and conductive connector row 106b is coupled to conductive column 120 through a via 180. The numbers and layout of the conductive connector rows for reprogramming cell 70 have been designed to provide flexibility of interconnection to the underlying conductive columns and conductive connector columns.

Figure 7A:
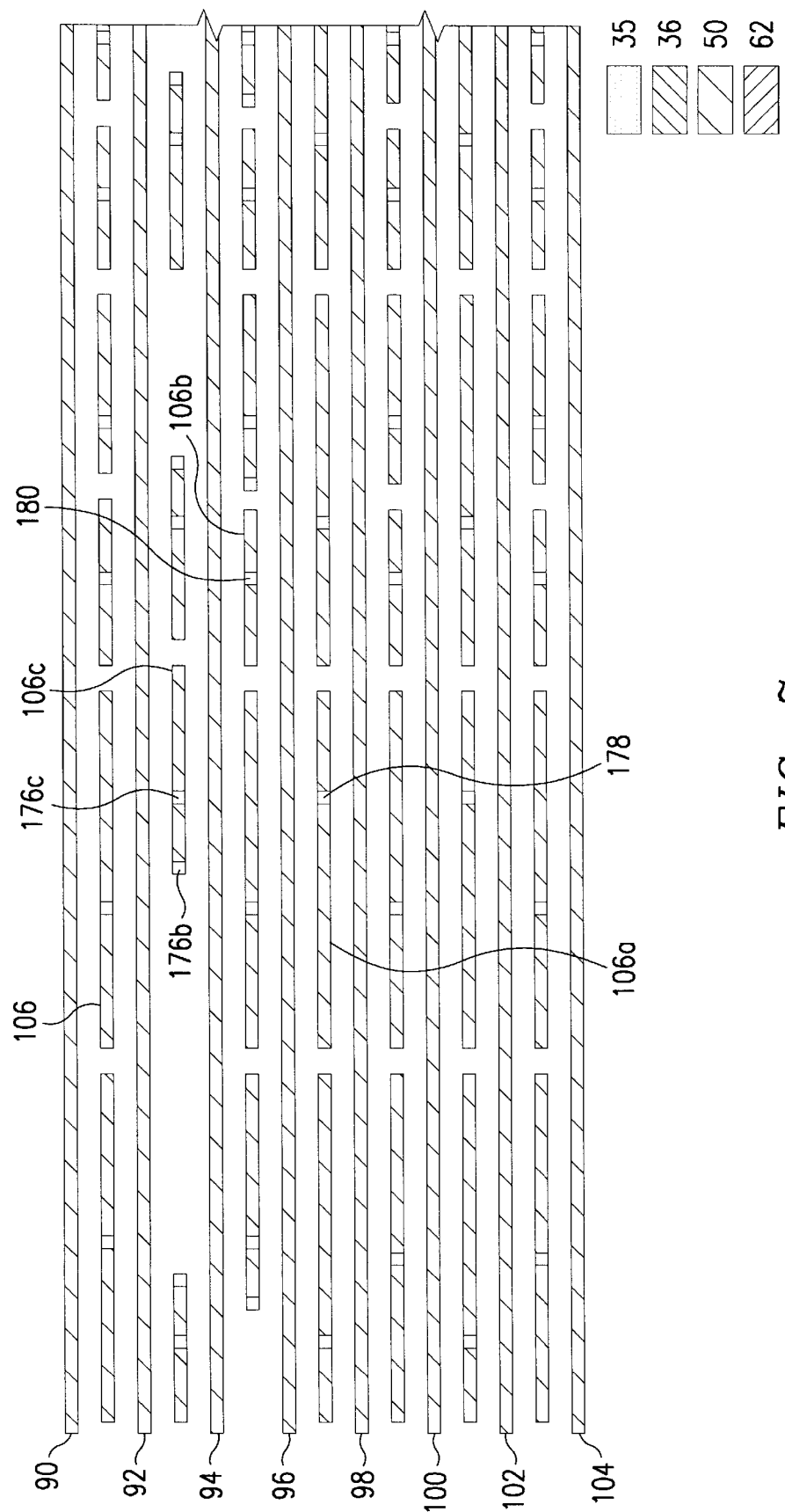
FIG. 7a and 7b are enlarged, partial views of the top conductive layer of the reprogramming cell of FIG. 6.
Figure 7B:
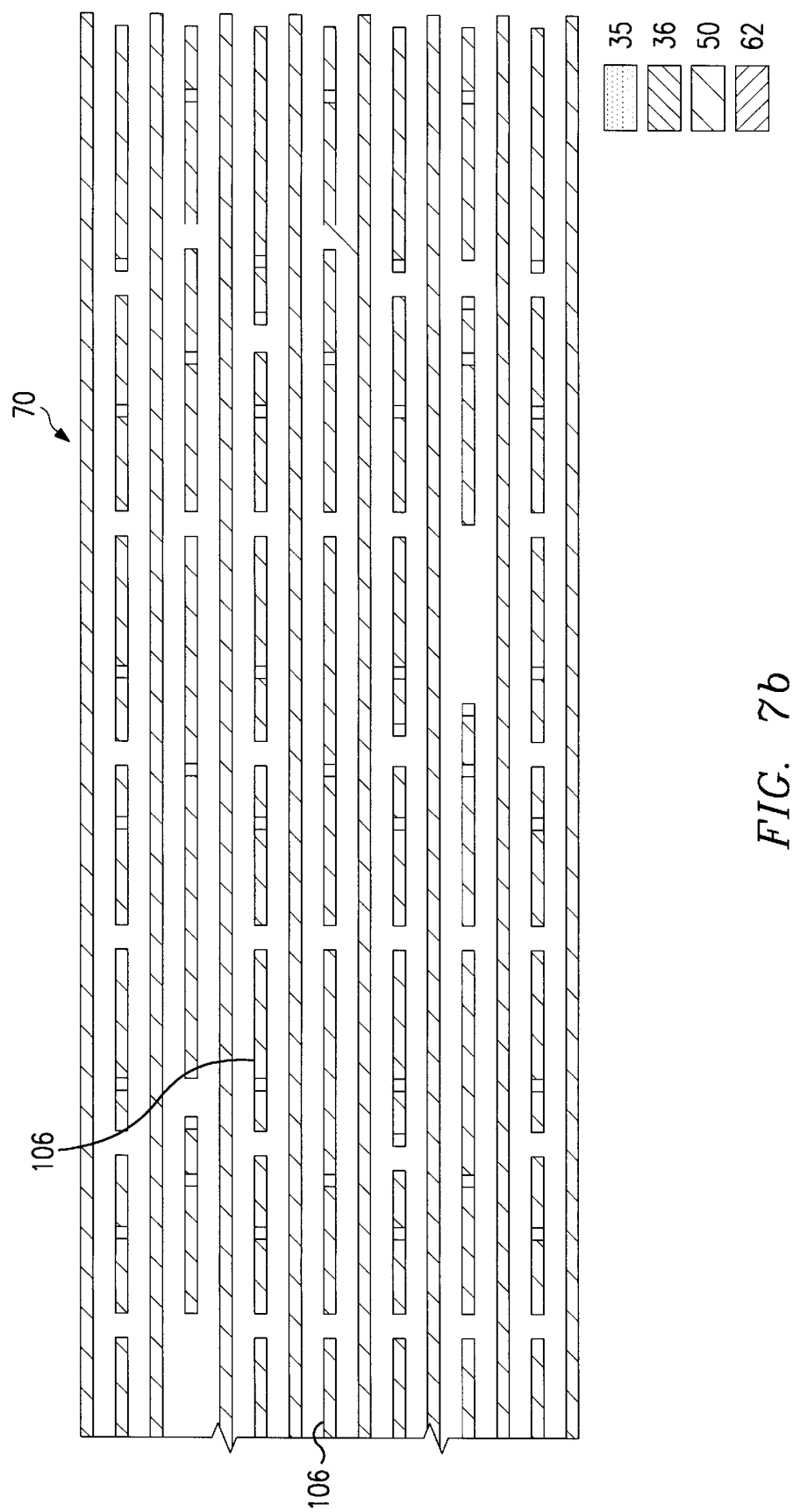
Figure 7C:
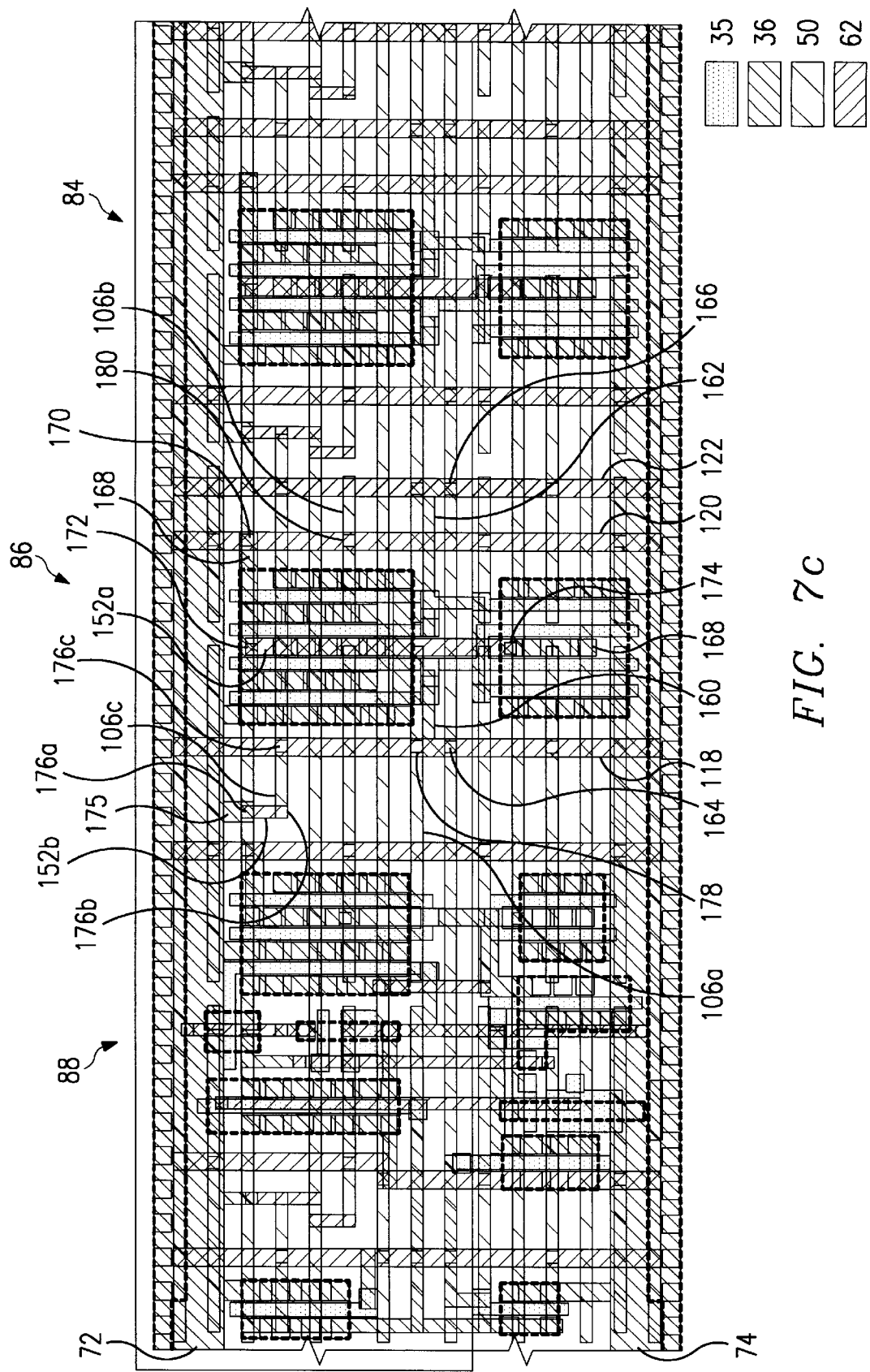
FIG. 7c and 7d are enlarged, partial views of the reprogramming cell of FIG. 6.
Figure 7D:
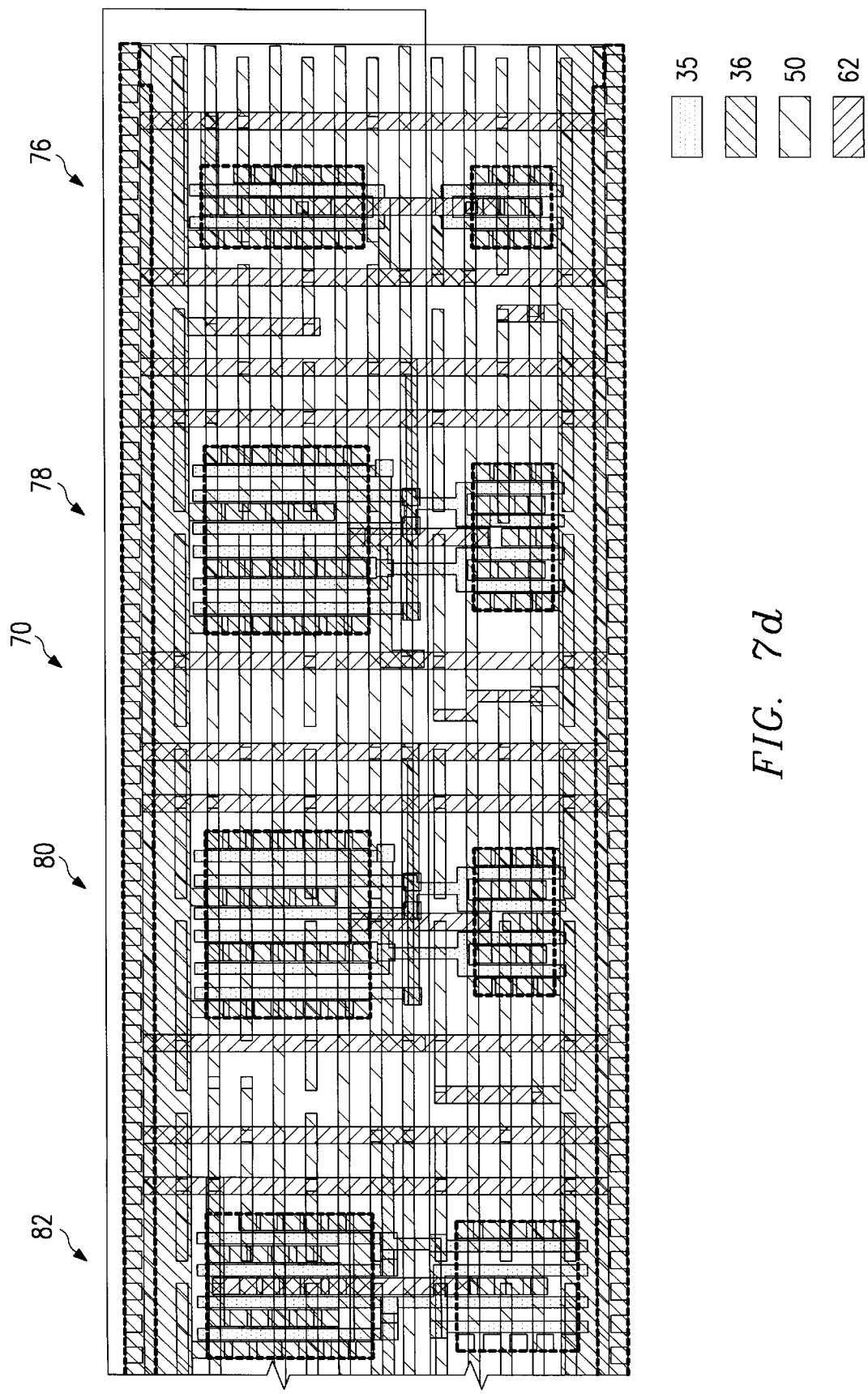

As shown most clearly in FIGS. 7a and 7b, conductive rows 90, 92, 94, 96, 98, 100, 102, and 104 are not coupled to any other conductive line in microprocessor 10.

Referring to FIGS. 2 and 7, one should note that although first conductive layer 36, including the standard cell cites, is generally oriented in the x-axis direction; second conductive layer 62, including spare column cells 60, 62, 64, 66, and 68, conductive columns 110, 116, 118, 120, 122, 124, 126, 128, 130, 132, 134, 136, 138, 140, 142, 144, 146, 148, and 150, and conductive connector columns 152, is generally oriented in the y-axis direction; and top conductive layer 50, including spare row cells 40, 42, 44, 46, and 48, conductive rows 90, 92, 94, 96, 98, 100, 102, and 104, and conductive connector rows 106, is generally oriented in the x-axis direction, such orientation is to maximize routing efficiency in microprocessor 10 and is application specific. Therefore, one should note that the present invention is fully applicable in a microprocessor having standard cell cites in a first conductive layer generally oriented in the y-axis direction, conductive lines in a second conductive layer generally oriented in the x-axis direction, and conductive lines in top conductive layer generally oriented in the y-axis direction.

Reprogramming cell 70; spare row cells 40, 42, 44, 46, and 48; and spare column cells 60, 62, 64, 66 and 68 can be used to debug errors or implement prototype design changes in microprocessor 10 according to the following, preferred procedure.

Figure 8:
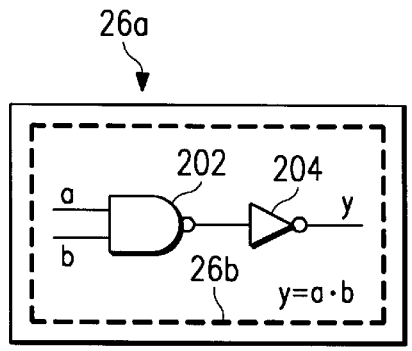
FIG. 8 is a block diagram of an exemplary standard logic cell of the functional unit of FIG. 2.
Figure 9:
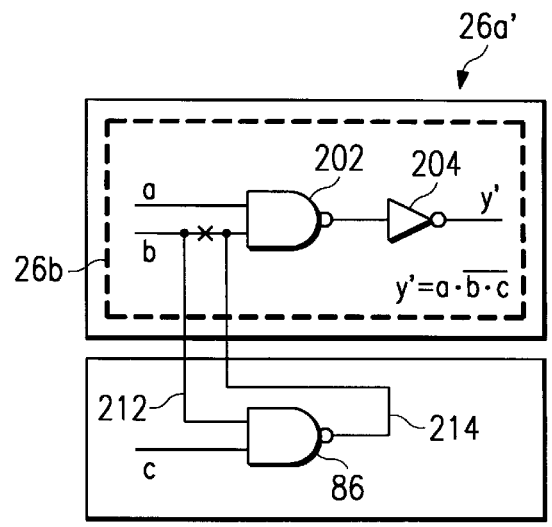
FIG. 9 is a block diagram of the exemplary standard logic cell of FIG. 8 modified by the reprogramming cell of FIG. 6.

FIGS. 3, 8, and 9 schematically illustrate an exemplary prototype design change to standard logic cell 26a of ACEX unit 20. As shown in FIGS. 3 and 8, device 26b of standard logic cell 26a includes a NAND gate 202 coupled to an inverter 204. NAND gate 202 has inputs a and b. Therefore, the output y of device 26b can be expressed as y=a·b. However, according to a prototype design change, the desired output of device 26b is y'=a·$\overline{b}$·c. As shown in FIG. 9, the desired change is implemented by coupling NAND gate 86 of reprogramming cell 70 with input b to NAND gate 202 of device 26b using interconnections 212 and 214.

Figure 10:
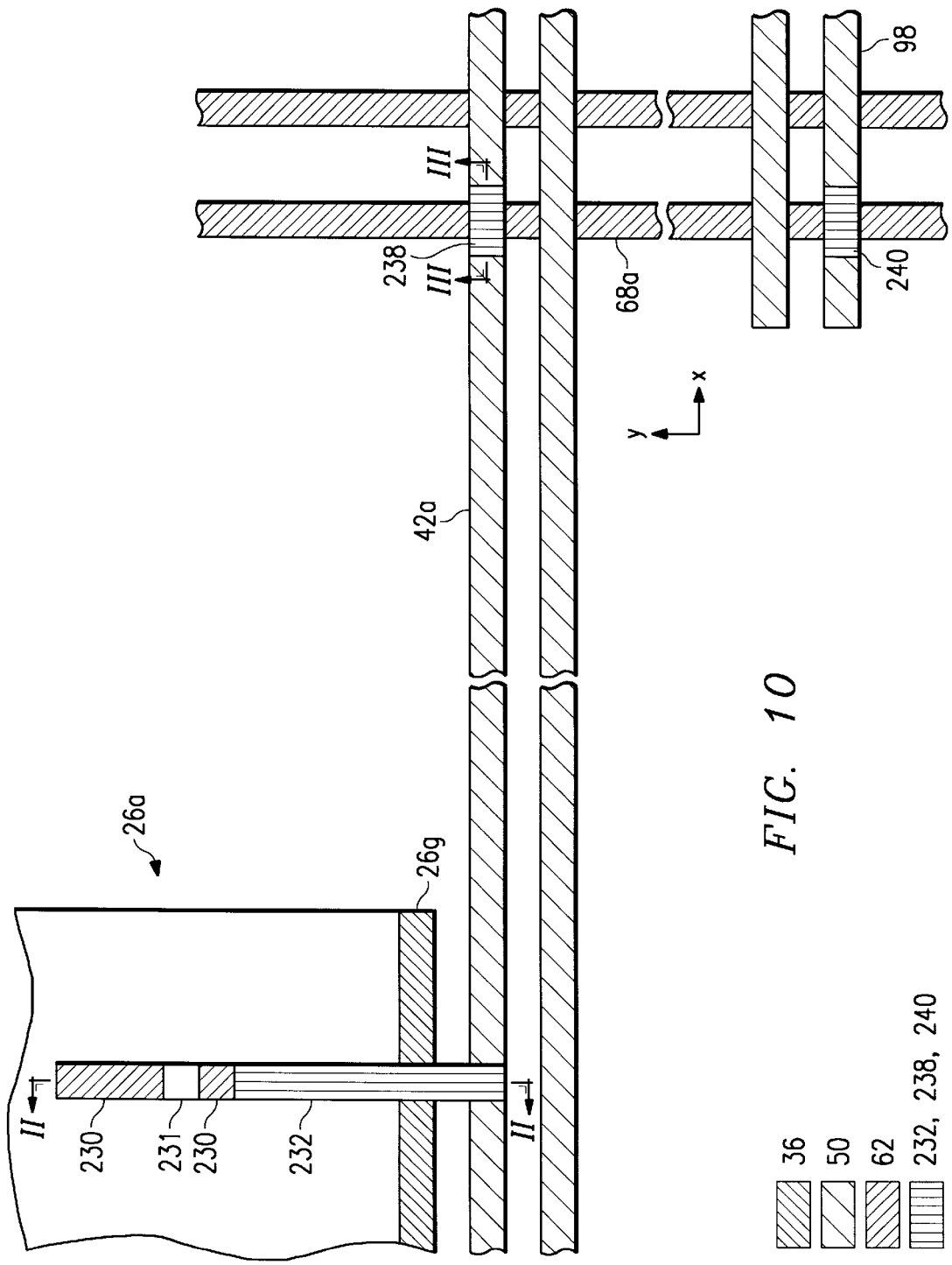
FIG. 10 is an enlarged illustration of the physical interconnection between the standard logic cell of FIG. 8 and an input line to the reprogramming cell of FIG. 6 according to the preferred embodiment of the present invention.
Figure 11:
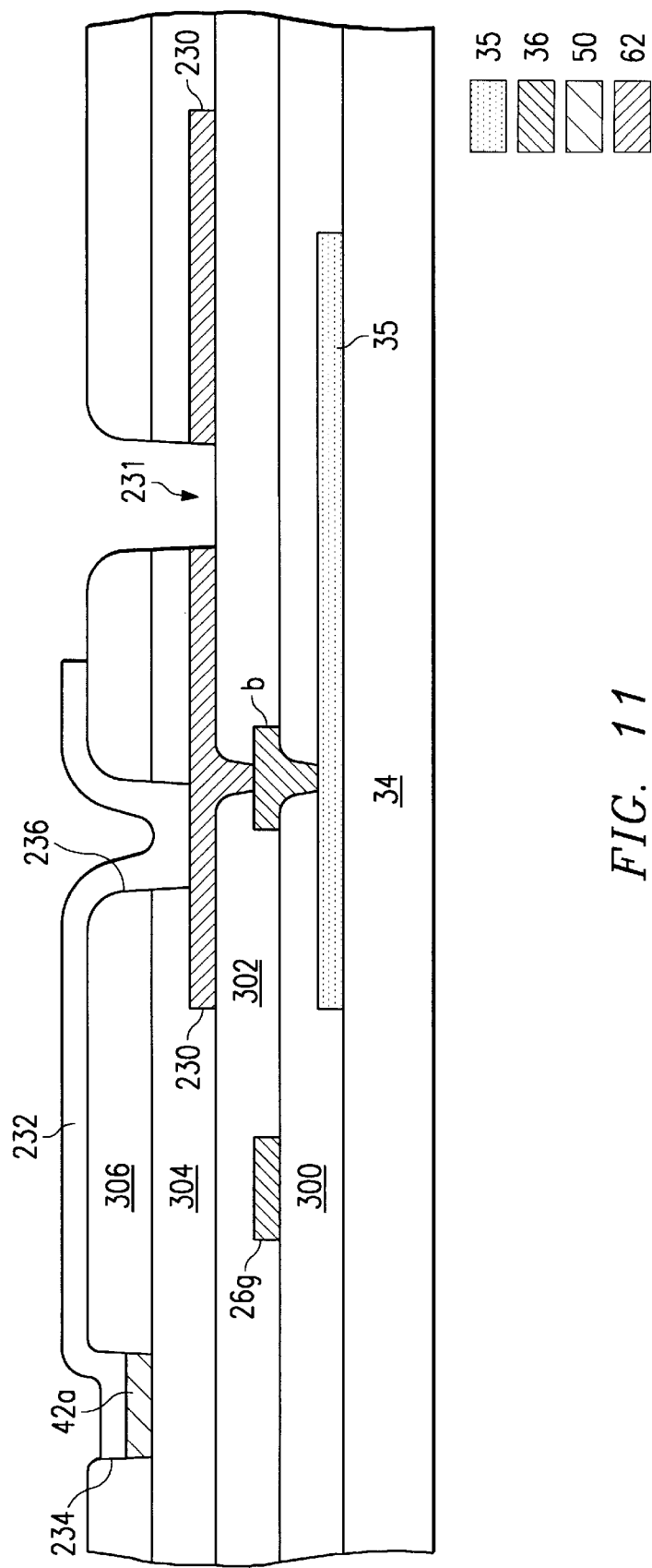
FIG. 11 is an enlarged, cross-sectional view of FIG. 10 along line II—II.

FIGS. 2, 10, 11, 12, and 13 illustrate the preferred procedure for physically implementing interconnection 212 of FIG. 9 to couple input b of NAND gate 202 of device 26b with an input to NAND gate 86 of reprogramming cell 70. Insulator layers are not shown in FIGS. 10 and 13 for purposes of illustration. First, as shown in FIGS. 10 and 11, a focused ion beam (FIB) is used to cut through insulator layer 306, insulator layer 304, and conductive line 230 in standard logic cell 26a, creating a discontinuity 231. As is most clearly shown by FIG. 11, conductive line 230 preferably resides on second conductive layer 62 and is coupled with input b, which preferably resides on first conductive layer 36.

Second, referring to FIGS. 2, 10, and 11, conductive line 230 is then coupled to spare row 42a. As shown most clearly in FIG. 11, this coupling is achieved by (1) using a FIB to cut a via 234 in insulator layer 306 to gain access to spare row 42a, (2) using a FIB to cut a via 236 in insulator layers 306 and 304 to gain access to conductive line 230, and (3) using a FIB to deposit a conductive line 232 within via 234, on top of insulator layer 306, and within via 236. Because spare row cells 40, 42, 44, 46, and 48 are preferably equally spaced in the y-axis direction no more than about 1000 μm apart, and most preferably no more than about 540 μm apart, conductive line 232 preferably has a length of no more than about 500 μm, and most preferably no more than about 270 μm. This length of conductive line 232 substantially increases the reliability of conductive line 232 and minimizes the time required to form conductive line 232.

Figure 12:
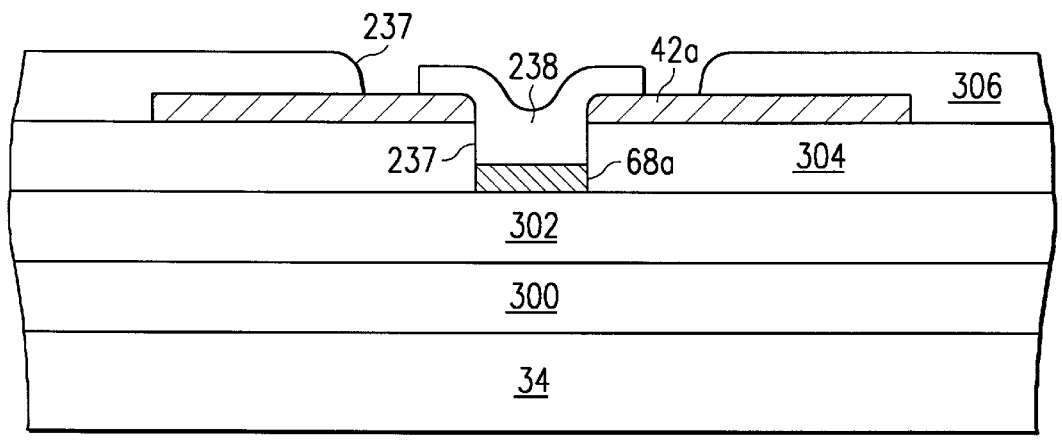
FIG. 12 is an enlarged, cross-sectional view of FIG. 10 along line III—III.
Figure 15A:
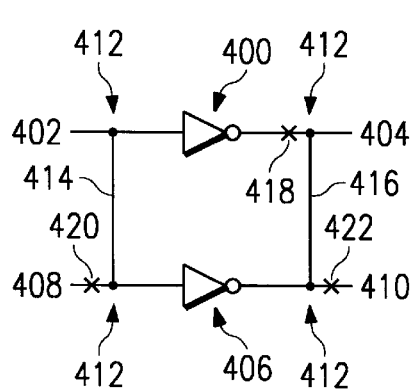
FIG. 15a illustrates a first example of implementing a debugging fix or prototype design change in an integrated circuit using conventional FIB interconnection techniques.
Figure 15B:
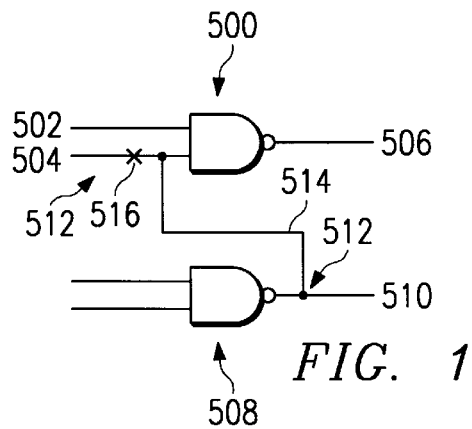
FIG. 15b illustrates a second example of implementing a debugging fix or prototype design change in an integrated circuit using conventional FIB interconnection techniques.

Third, as shown in FIGS. 2, 10, and 12, spare row 42a is coupled to spare column 68a. Referring to FIG. 12, this coupling is achieved by (1) using a FIB to create a via 237 through insulator layer 306, spare row 42a, and insulator layer 304 to gain access to spare column 68a and (2) using a FIB to deposit a conductive material 238 within via 237 and on top of spare row 42a. The depth of conductive material 238 within via 237 corresponds to the thickness of a conductive layer plus the separation between conductive layers on microprocessor 10 and is typically on the order of 2 μm. As the depth of conductive material 238 is much less than 500 μm, conductive material 238 can be formed reliably and quickly with a FIB.

Fourth, as shown in FIGS. 2 and 10, spare column 68a is coupled to conductive row 98. This coupling is achieved by (1) using a FIB to create a via through insulator layer 306, conductive row 98, and insulator layer 304 to gain access to spare column 68a (not shown) and (2) using a FIB to deposit a conductive material 240 within the via and on top of conductive row 98. The cross-section of this coupling is similar to the cross-section shown in FIG. 12 for the coupling of spare row 42a and spare column 68a.

Fifth, as shown in FIG. 13, conductive row 98 is coupled to conductive connector row 106a. This coupling is achieved by using a FIB to (1) create a via through insulator layer 306 (not shown) to gain access to conductive row 98, (2) create a via through insulator layer 306 to gain access to conductive connector row 106a (not shown), and (3) deposit a conductive line 240 on top of conductive row 98, insulator layer 306, and conductive connector row 106a. The length of conductive line 240 corresponds to the separation between conductive rows and conductive connector rows in reprogramming cell 70 and is typically less than 1 μm. As the length of conductive line 240 is much less than 500 μm, conductive line 240 can be formed reliably and quickly with a FIB. As discussed previously in connection with FIGS. 7c and 7d, conductive connector row 106a is already coupled to input line 160 of NAND gate 86 through via 178, conductive column 118, and via 164.

Sixth, interconnection 212 is completed by using a FIB to cut conductive connector row 106c to create discontinuity 241, as shown in FIG. 13. As described previously in connection with FIGS. 7c and 7d, conductive connector row 106c couples input line 160 of device 86 to common power line 72 when device 86 is non-operational.

Figure 14:
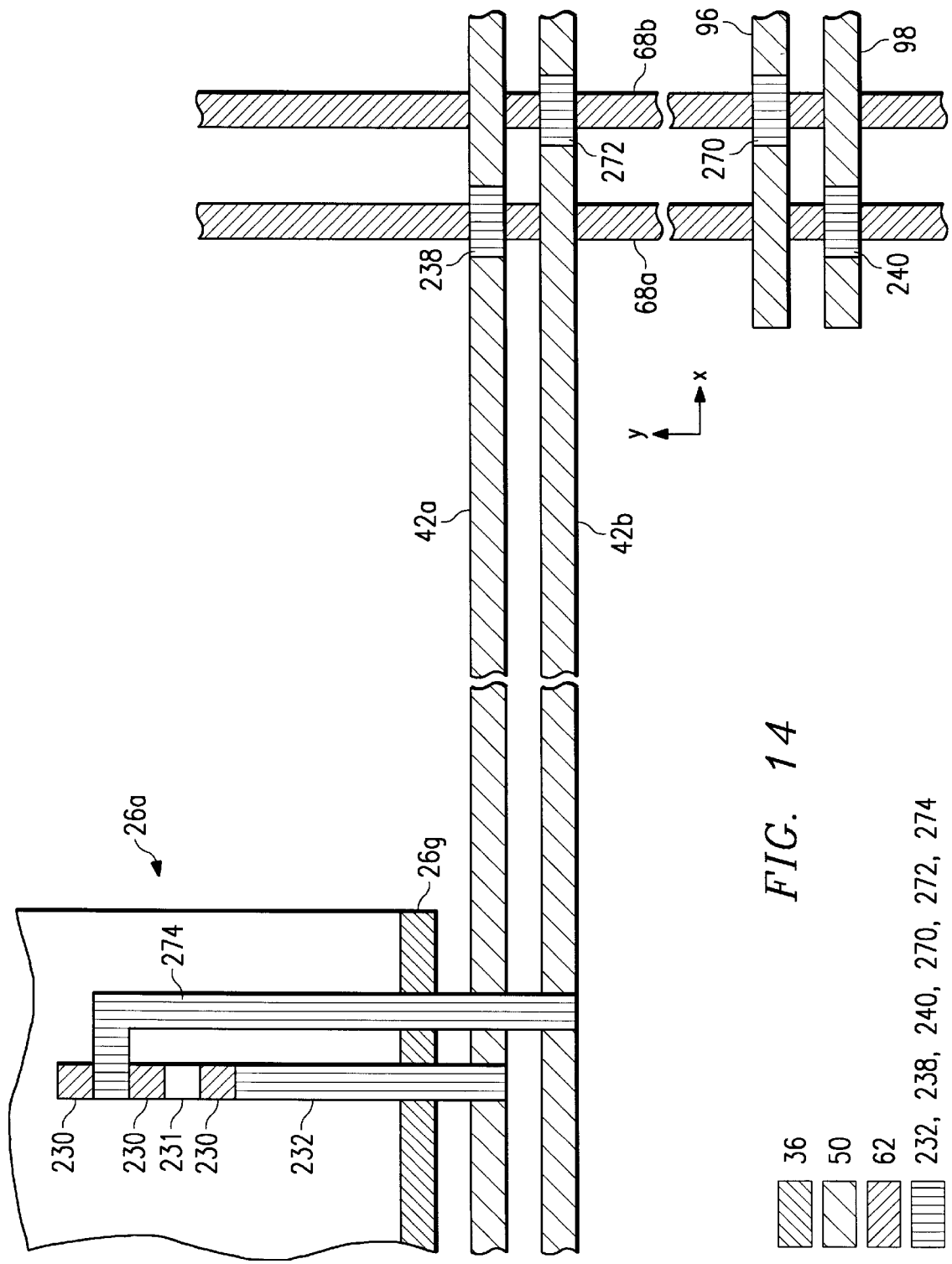
FIG. 14 is an enlarged illustration of the physical interconnection between the output line from the reprogramming cell of FIG. 6 to the standard logic cell of FIG. 8 according to the preferred embodiment of the present invention.

Similarly, FIGS. 2, 13, and 14 illustrate the preferred procedure for physically implementing interconnection 214 of FIG. 9 to couple the output of NAND gate 86 of reprogramming cell 70 with input b of NAND gate 202 of device 26b. Insulator layers are not shown in FIG. 14 for purposes of illustration. First, as shown in FIG. 13, conductive connector row 106b is coupled to conductive row 96 by using a FIB to (1) create a via through insulator layer 306 (not shown) to gain access to conductive row 96, (2) create a via through insulator layer 306 to gain access to conductive connector row 106b (not shown), and (3) deposit a conductive line 242 on top of conductive row 98, insulator layer 306, and conductive connector row 106a. The length of conductive line 242 corresponds to the separation between conductive rows and conductive connector rows in reprogramming cell 70 and is typically less than 1 μm. As the length of conductive line 242 is much less than 500 μm, conductive line 242 can be formed reliably and quickly with a FIB. As discussed previously in connection with FIGS. 7c and 7d, conductive connector row 106b is coupled to output line 168 of NAND gate 86 through via 180, conductive column 120, and via 170.

Second, as shown in FIGS. 2 and 14, spare column 68b is coupled to conductive row 96. This coupling is achieved by (1) using a FIB to create a via through insulator layer 306, conductive row 96, and insulator layer 304 to gain access to spare column 68b (not shown) and (2) using a FIB to deposit a conductive material 270 within the via and on top of conductive row 96. The cross-section of this coupling is similar to the cross-section shown in FIG. 12 for the coupling of spare row 42a and spare column 68a.

Third, as shown in FIGS. 2 and 14, spare row 42b is coupled to spare column 68b. This coupling is achieved by (1) using a FIB to create a via through insulator layer 306, spare row 42b, and insulator layer 304 to gain access to spare column 68b (not shown) and (2) using a FIB to deposit a conductive material 272 within the via and on top of spare row 42b. The cross-section of this coupling is similar to the cross-section shown in FIG. 12 for the coupling of spare row 42a and spare column 68a.

Fourth, referring to FIGS. 2 and 14, conductive line 230 is then coupled to spare row 42b. This coupling is achieved by (1) using a FIB to cut a via in insulator layer 306 to gain access to spare row 42b (not shown), (2) using a FIB to cut a via in insulator layers 306 and 304 to gain access to conductive line 230 on the side of discontinuity 231 opposite conductive line 232, and (3) using a FIB to deposit a conductive line 274 within the two vias and on top of insulator layer 306. Because spare row cells 40, 42, 44, 46, and 48 are preferably equally spaced in the y-axis direction no more than about 1000 μm apart, and most preferably no more than about 540 μm apart, conductive line 274 preferably has a length of no more than about 500 μm, and most preferably no more than about 270 μm. This length of conductive line 274 substantially increases the reliability of conductive line 274 and minimizes the time required to form conductive line 274.

One should note that the order of above-described steps used to create interconnections 212 and 214 are merely preferred and not critical. Therefore, these steps may be performed in a different order for specific applications. In addition, due to the flexibility of interconnection provided by spare row cells 40, 42, 44, 46, and 48; spare column cells 60, 62, 64, 66, and 68; conductive rows 90, 92, 94, 96, 98, 100, 102, and 104; conductive connector rows 106; conductive columns 110, 116, 118, 120, 122, 124, 126, 128, 130, 132, 134, 136, 138, 140, 142, 144, 146, 148, and 150; and conductive connector columns 152, a variety of possible routings exist to form interconnections 212 and 214. Furthermore, one should also note that input c of NAND gate 86 in FIG. 9, which corresponds to input line 162 of NAND gate 86 in FIG. 7c, must also be interconnected in a manner similar to interconnections 212 and 214 to implement the prototype design change of FIG. 9. Finally, although the preferred procedure for using reprogramming cell 70; spare row cells 40, 42, 44, 46, and 48; and spare column cells 60, 62, 64, 66, and 68 has been described above in connection with a prototype design change, the procedure is also fully applicable for debugging fixes.

From the above, it may be appreciated that the present invention provides the ability to implement debugging fixes and prototype design changes on integrated circuits in a more timely and reliable manner than conventional methods. In particular, the present invention provides such reprogramming ability without requiring any modification of masks and remanufacturing of the circuit, and without requiring conductive interconnections made by a FIB more than 500 µm in length.

While the present invention has been described in detail, various alterations, modifications, and substitutions could be made which would not affect the scope of the invention. For example, while the reprogramming cell, spare row cells, and spare column cells of the preferred embodiment have been described in connection with the address calculation/execution unit of a microprocessor, the present invention is fully applicable to any functional unit of a microprocessor. As a further example, while the reprogramming cell, spare row cells, and spare column cells of the preferred embodiment have been described in connection with the automated place and route area of a functional unit of a microprocessor, the present invention is fully applicable to the custom layout areas of a functional unit of a microprocessor. As a further example, an interconnection between conductive layers formed by a focused ion beam (FIB) may be formed by inserting a conductive plug into a via created by the FIB before depositing a conductive material into the via with the focused ion beam. Consequently, while the invention has been described in connection with what is presently considered to be the most practical and preferred embodiment, it is to be understood that the invention is not limited to the disclosed embodiment and is intended to cover various modifications and equivalent arrangements included within the spirit and scope of the following claims.

What is claimed is:

1. An integrated circuit, comprising:
    a plurality of devices formed in a semiconductor layer;
    a reprogramming cell, comprising:
        a plurality of spare devices formed in said semiconductor layer, each of said spare devices having an input line and an output line formed in a first conductive layer, said first conductive layer being the first conductive layer above said semiconductor layer in said integrated circuit;
        a first set of columns formed on a second conductive layer, said second conductive layer being the first conductive layer below a top conductive layer of said integrated circuit, wherein respective ones of said first set of columns are coupled with respective ones of said input lines to said spare devices;
        a second set of columns formed on said second conductive layer, wherein respective ones of said second set of columns are coupled with respective ones of said output lines to said spare devices;
        a plurality of connector rows formed on said top conductive layer, wherein respective ones of said connector rows are coupled with respective ones of said first set of columns, and wherein respective ones of said connector rows are coupled with respective ones of said second set of columns; and
        a plurality of rows formed on said top conductive layer for coupling with said connector rows; and
    a spare column cell formed in said second conductive layer for coupling with said plurality of rows in said reprogramming cell; and
    a spare row cell formed in said top conductive layer for coupling with said spare column cell and said plurality of devices.

2. The integrated circuit of claim 1 wherein said spare column cell comprises a plurality of spare columns.

3. The integrated circuit of claim 1 wherein said spare row cell comprises a plurality of spare rows.

4. The integrated circuit of claim 1 wherein said plurality of devices comprise a standard cell cite having a plurality of standard logic cells housing said plurality of devices.

5. The integrated circuit of claim 1 and further comprising a plurality of spare row cells equally spaced no more than about 1000 µm apart.

6. The integrated circuit of claim 1 and further comprising a plurality of spare column cells equally spaced no more than about 1000 µm apart.

7. The integrated circuit of claim 1 wherein said connector rows are formed between said plurality of rows.

8. The integrated circuit of claim 7 wherein a spacing between said connector rows and said plurality of rows is less than about 1 µm.

* * * * *